United States Patent [19]

Rudy, Jr. et al.

[11] Patent Number: 5,388,995
[45] Date of Patent: Feb. 14, 1995

[54] EMI/RFI PROTECTIVE CABLE INTERFACE FOR HIGH DENSITY JUNCTION BOX

[75] Inventors: William J. Rudy, Jr., Annville;
Howard R. Shaffer, Millersburg;
Daniel E. Stahl, Hummelstown, all of Pa.

[73] Assignee: The Whitaker Corporation, Wilmington, Del.

[21] Appl. No.: 76,655

[22] Filed: Jun. 11, 1993

[51] Int. Cl.⁶ .................................. H01R 23/70
[52] U.S. Cl. ......................... 439/61; 439/607;
361/730; 361/796; 361/800
[58] Field of Search .............. 361/729–731,
361/734, 735, 796, 797, 799, 800, 818; 439/374, 61, 607, 377

[56] References Cited

U.S. PATENT DOCUMENTS

| | | | |
|---|---|---|---|
| 3,491,330 | 1/1970 | Barnhart et al. | 439/681 |
| 3,562,696 | 2/1971 | Barnhart et al. | 439/278 |
| 3,640,141 | 2/1972 | Hollingsead et al. | 74/89.15 |
| 3,999,830 | 12/1976 | Herrmann, Jr. et al. | 439/610 |
| 4,486,721 | 12/1984 | Cornelius et al. | 333/1 |
| 4,509,258 | 4/1985 | Locati et al. | 29/876 |
| 4,525,769 | 6/1985 | Lehmann | 361/386 |
| 4,874,337 | 10/1989 | Paukovits, Jr. et al. | 439/609 |
| 4,953,716 | 9/1990 | Rapoport | 211/107 |
| 5,045,977 | 9/1991 | Cesar | 361/424 |

Primary Examiner—Gary F. Paumen
Attorney, Agent, or Firm—Anton P. Ness

[57] ABSTRACT

An input/output interface for a junction box (10) having an array of connectors (80) exposed for mating to corresponding connectors (150) terminated to cables (152). The cable connectors (150) are affixed to a rugged panel member (110) which is mounted to a rack (100) into which the junction box (10) is placed, in a manner permitting float during mating with the array of junction box connectors (80). Backshells (166) are secured to the cable connectors (150) which assures no EMI/RFI leakage within the shells (164) of the connectors when mated.

16 Claims, 8 Drawing Sheets

EMI/RFI PROTECTIVE CABLE INTERFACE FOR HIGH DENSITY JUNCTION BOX

FIELD OF THE INVENTION

The present invention is directed to the field of structures for containing electrical and electronic components and systems, and more particularly to input/output cable interfaces for junction boxes providing for blindmating of the connectors thereof.

BACKGROUND OF THE INVENTION

Enclosures are known, termed black boxes, which contain circuit cards and electronic components and circuitry therefor, which are interconnected to input/output conductors at an interface. Such black boxes are commonly utilized in electronics bays of aircraft and ships for example and are mounted on racks or shelves to be easily removed for repair, servicing and testing. The input/output interface commonly contains mounted thereon a first electrical connector to which is matable a second electrical connector terminated to a cable containing a plurality of electrical conductors, and commonly the connectors are manually mated and then secured in the mated condition to the black box structure.

Examples of connectors commonly used in such mated arrangements are disclosed in U.S. Pat. Nos. 3,491,330; 3,562,696; 4,509,258 and 4,874,337. in which dielectric inserts containing arrays of terminals terminated to respective conductors of a cable, are affixed within a protective shell member adapted to be secured by fasteners to a panel.

It is desired to provide an interface for automatically mating one or more cable connectors to corresponding connectors along a rear wall of an enclosure, upon moving the enclosure into position in a shelf or rack, and permitting the removal of the enclosure if desired, without connector manipulation, tools or fastening or unfastening the connectors into or from the mated condition.

It is further desired to provide such an interface which provides inherent protection of the electronics within the enclosure from electromagnetic and radiofrequency interference.

SUMMARY OF THE INVENTION

The present invention is used in conjunction with an junction box enclosing an array of individual circuit boards or daughter cards, a backplane assembly to which the circuit boards are electrically connectable and disconnectable, and an input/output interface for electrically connecting the backplane to cables of discrete electrical conductors. The junction box includes a front panel traversing the front face which is adapted to be removable from the junction box, a pair of opposing side walls, upper and lower walls which include opposed pairs of card-guiding channels extending rearwardly from the front face, a backplane assembly traversing the rearward region of the enclosure, and a rear wall which completes the enclosure and provides for electrical connections of cables to the backplane assembly. The junction box defines an integral rugged electrically and thermally conductive envelope surrounding the backplane assembly and daughter cards which provides protection against electromagnetic interference (EMI) and radiofrequency interference (RFI) to assure the integrity of signals received, processed and transmitted by the electronic circuitry and components therewithin. The junction box also provides heat dissipation for the components therewithin which have been isolated from the otherwise cooling effect of ambient air flow usually relied upon to remove thermal energy from electronics bays.

The present invention provides an input/output interface between the junction box and the cables and includes a rugged frame mounted to the rack just rearwardly of the junction box on which are mounted connectors terminating the cables to be electrically connected to the backplane assembly within the junction box. Mating faces of the cable connectors face forwardly to mate with corresponding mating faces of cable-associated connectors of the backplane assembly exposed along the rear wall and facing rearwardly. During typical mounting of the junction box into its in-service location, the cables will already be installed in position within the aircraft with the cable connectors secured to the rugged frame mounted to the rack. The junction box is then positioned on the rack and urged rearwardly to its installed location, with the cable-associated connectors defined on the rear wall mate with the cable connectors float-mounted to the rugged frame, in a blind mating or rack-and-panel arrangement. Preferably a large diameter pin extends forwardly from the frame to be received into a corresponding hole of the rear wall of the junction box, cooperating to enhance resistance to vibration and to wear. The junction box is then secured in position by cooperation of locking mechanisms secured to the rack with complementary lock embossments on the bottom surface of the lower wall at the front face. Electrically conductive gaskets surround every opening in the junction box to provide an EMI/RFI seal at each possible incremental gap during in-service use, including the periphery of the front panel and the periphery of the mating faces of the cable-associated connector along the rear wall.

The front panel is securable to and removable from the junction box in its installed condition, thus enabling insertion and removal of individual daughter cards from the junction box as desired and without requiring removal of the junction box from its installed position. Preferably the front panel includes a pair of handles facilitating manipulation thereof. With the front panel removed, each daughter card in a vertical orientation can be moved along an associated pair of opposed guide channels extending rearwardly from the front face to the forward face of the backplane assembly, and then clamped in the fully inserted position all in a manner similar to conventional card cages.

The junction box of the present invention and the backplane assembly also are especially useful to define a wire integration system, in which circuits of the daughter cards can be connected as desired to any particular conductor of the input/output interface. A discrete member such as a circuit card insertable into the card cage, is disclosed which selectively interconnects the circuits through the interconnection circuitry of the backplane assembly. Such a discrete member, or matrix card, can be programmed and reprogrammed easily, with no changes being made which involve specific use customization or modification to the backplane assembly, and which greatly simplifies backplane construction for a high density of thousands of individual circuits.

The rear wall includes integral shrouds surrounding the mating faces of the cable-associated connectors which interfit with complementary shrouds of the cable connectors in a conventional plug/receptacle manner, and EMI/RFI ground members are mounted peripherally around the plug shrouds to establish a ground connection With the interior surface of the receptacle shrouds thus grounding the cable shields to the junction box and also assuring no EMI/RFI gap surrounding the mating faces of the connectors in the mated condition, and adapted to maintain such ground connection during mechanical vibration during in-service use. Preferably the cable connectors are mounted in apertures of the rugged frame in a manner permitting incremental transverse movement during mating upon initiation of the interfitting of the plug shrouds with the receptacle shrouds to precisely align the arrays of mating contact sections of the mating connectors, all as the junction box is being urged into its in-service position in the rack.

Backshells are easily mounted to the cable connectors and enclose the lengths of discrete conductor wires extending from each cable for EMI/RFI protection, and include integral flanges to which the shielding braids of each cable are affixed for grounding thereof; and the backshells are adapted to be clamped to the cable outer insulative jackets to provide strain relief for the cable connectors. Each backshell may be an integral four-sided member first placed loosely onto the cable prior to terminating the conductors thereof to respective terminals and securing the terminals into the housings of the cable connectors, and then moved against the cable connectors and mounted thereto before securing the loaded connectors into respective apertures, and then securing the shielding braid about the backshell flange. In a second embodiment, a backshell may also be assembled about the connector after conductor termination and securing the connector to the frame, in which case the backshell may later be opened to repair or replace a terminal without first requiring total connector removal, and also permitting the drain wires to be grounded to the backshell.

It is an objective of the present invention to provide a matable interface between an array of connectors across a rear wall of a junction box with a corresponding array of connectors affixed to conductor cables externally of the junction box.

It is a further objective for the matable interface to provide for securing the cable connectors to a rugged frame member of a rack into which the junction box will be placed, prior to mating with the junction box connectors at the input/output interface.

It is an additional objective to provide for the cable connectors to incrementally adjust their position to precisely align with corresponding connectors of the junction box rear wall during placement of the junction box into the rack.

It is yet another objective to provide for protection against EMI/RFI leakage into the junction box at the multi-connector input/output interface.

An embodiment of the present invention will now be disclosed by way of example with reference to the accompanying drawings.

DETAILED DESCRIPTION OF THE PREFERRED EMBODIMENT

Figure 1:
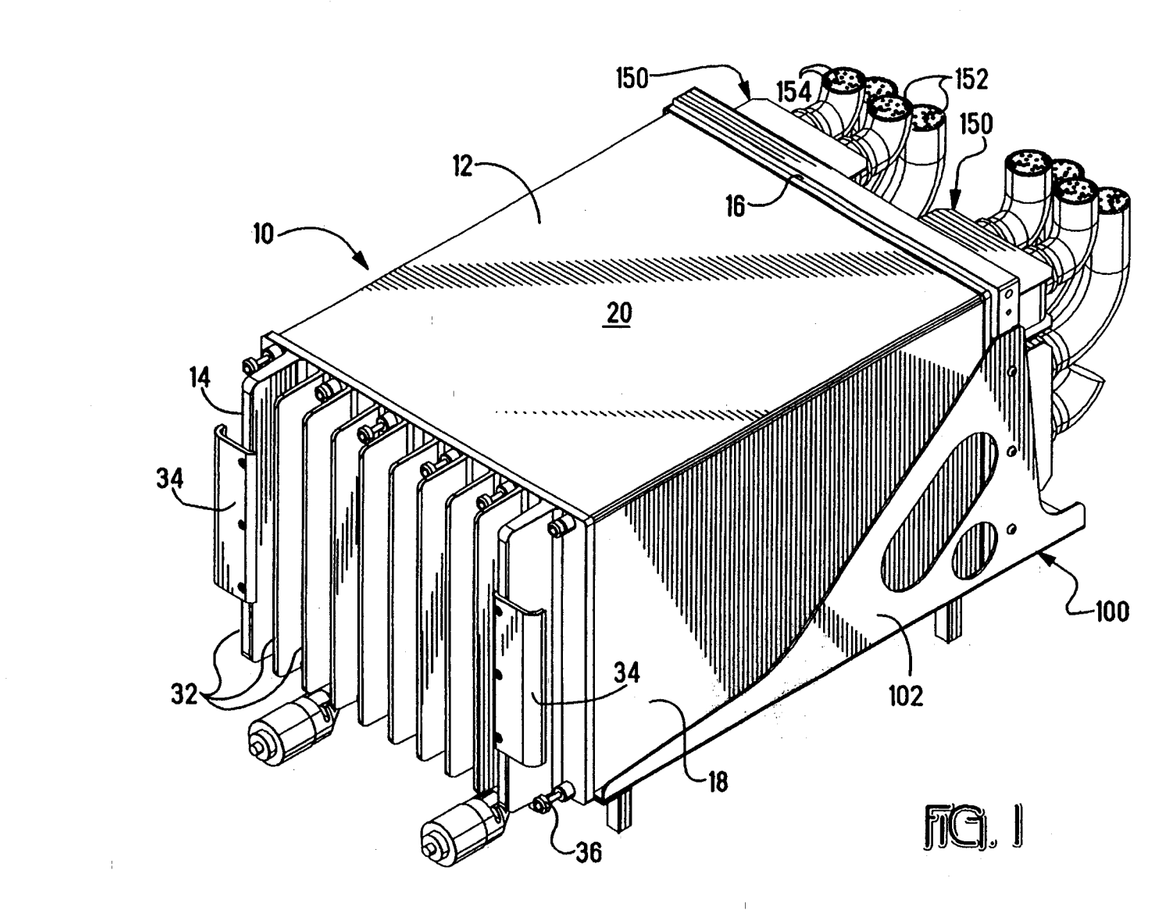
FIG. 1 is an isometric view of the junction box of the present invention secured in position within a rack assembly.
Figure 2:
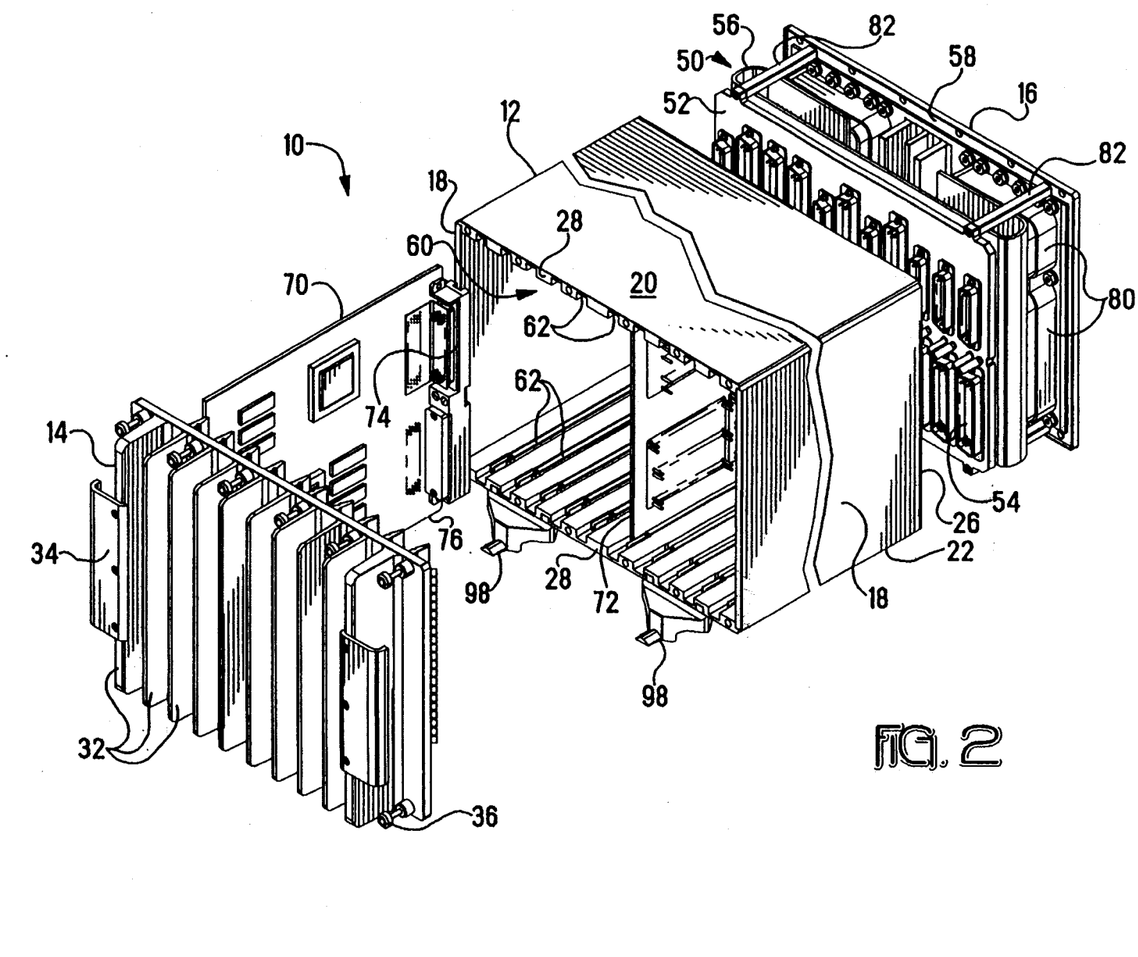
FIG. 2 is an exploded isometric view of the junction box of FIG. 1.
Figure 4:
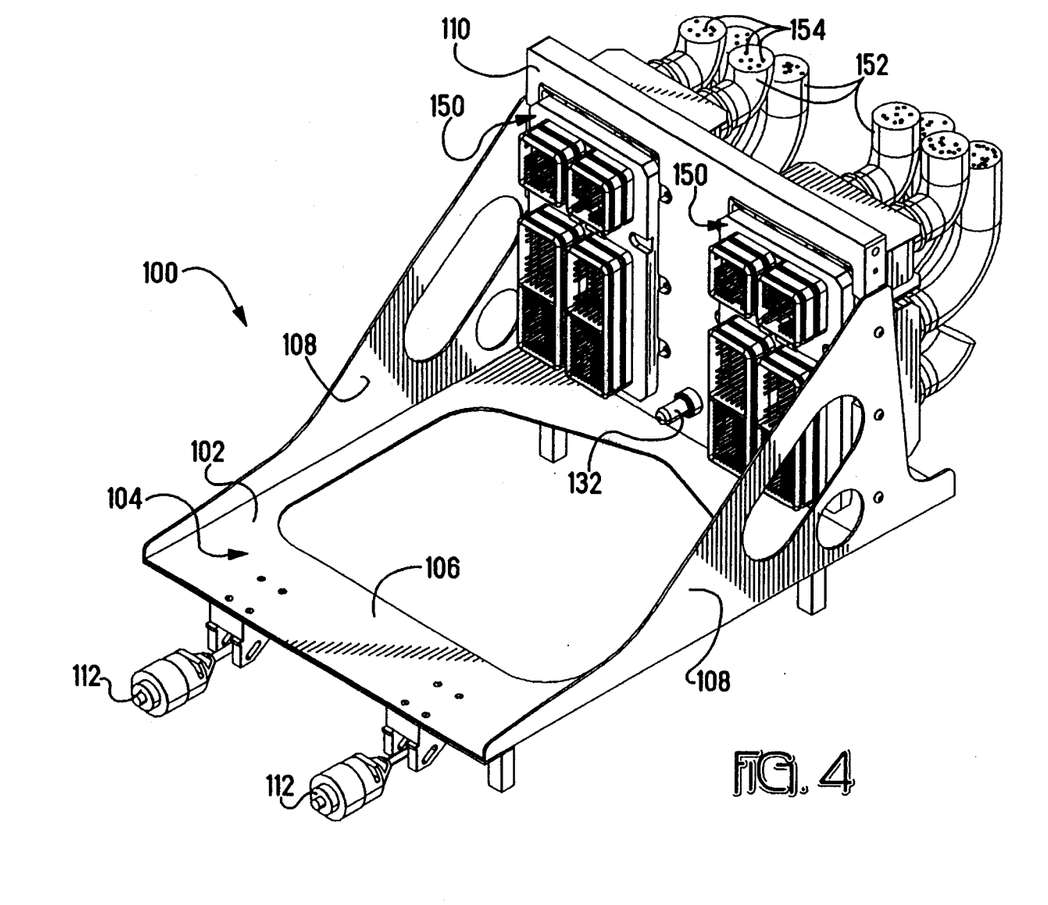
FIGS. 4 and 5 are isometric views of the rack assembly of FIG. 1, assembled and exploded respectively, showing the cable connectors mounted therein at the input/output interface of the junction box and the rack assembly.
Figure 5:
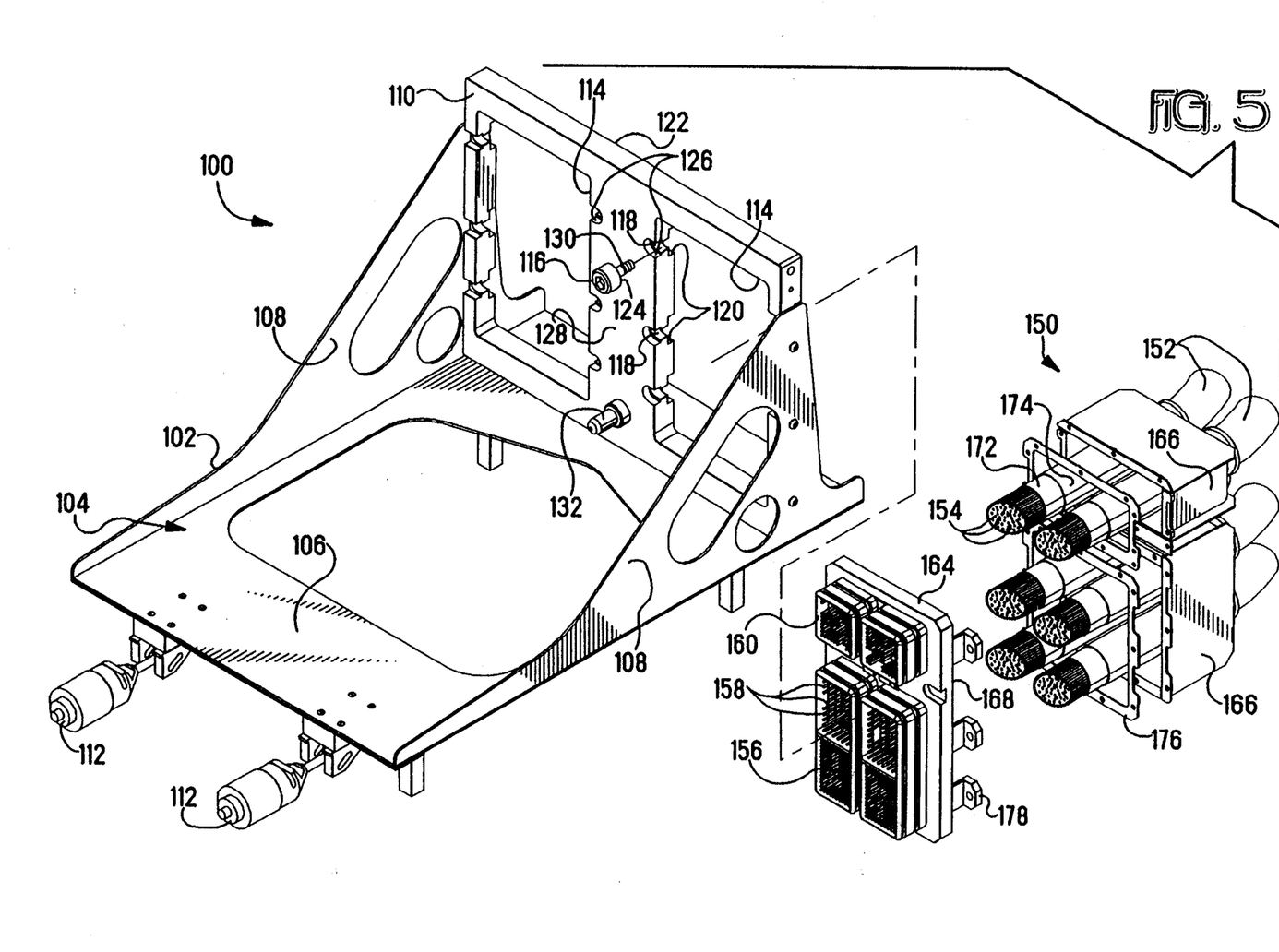
Figure 6:
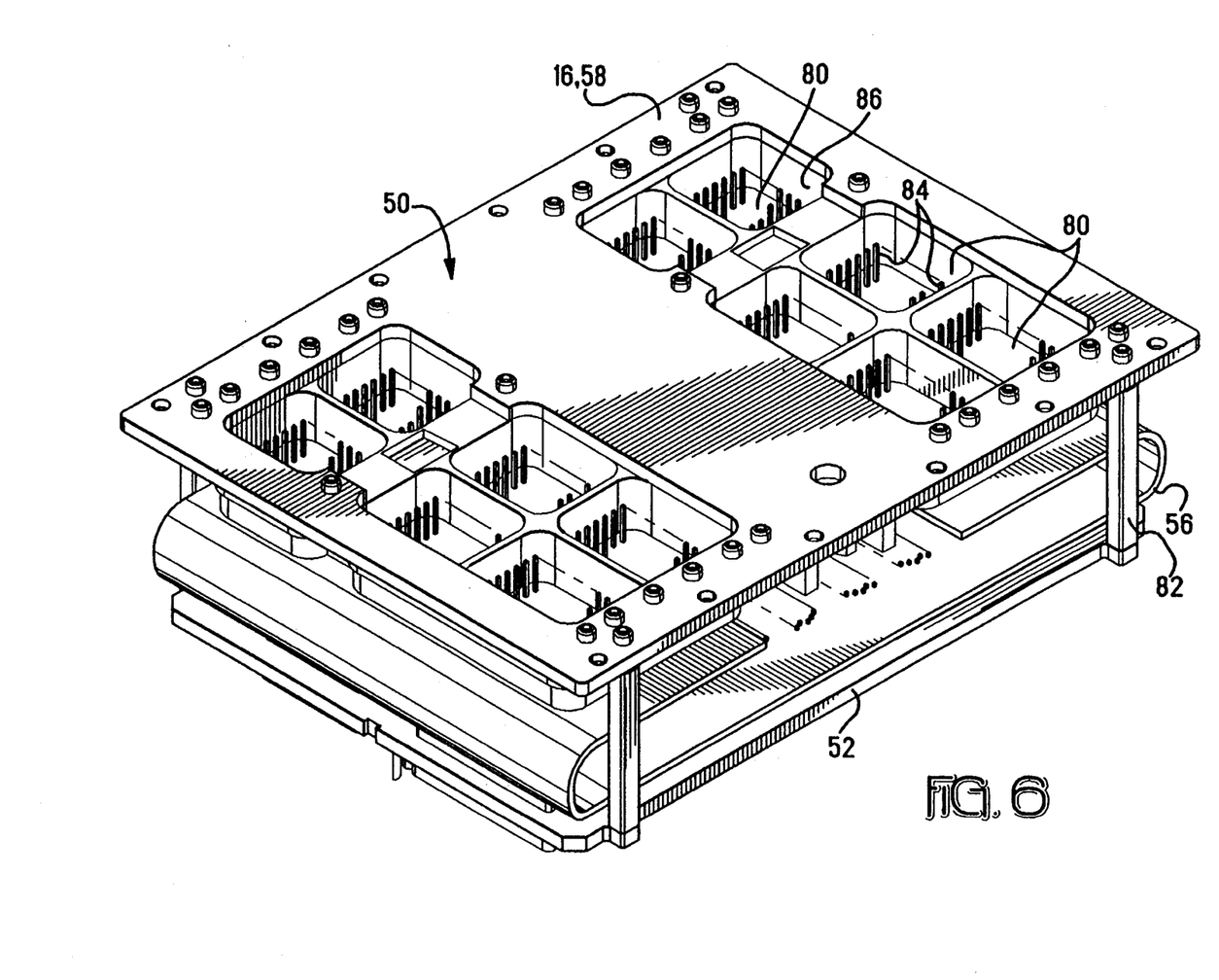
FIG. 6 is an isometric view of the rear wall of the junction box, which is part of the backplane assembly for the junction box, showing the input/output connectors thereof at the input/output interface.

Junction box 10 of FIGS. 1 and 2 includes a box-like body section 12, front panel 14 and rear wall 16 with box section 12 having opposing side walls 18 and top wall 20 and bottom wall 22 and extends from front face 24 to rear face 26 defining a card-receiving region 60 extending inwardly from front face 24. Front panel 14 includes an array of exterior fins 32, to two of which are mounted a pair of handles 34 enabling manual gripping of the front panel for handling during removal from junction box 10, and is mountable to front face 24 using fasteners 36 secured about the periphery threaded into forward edges 28 of the top and bottom walls 20,22. Junction box 10 is preferably used in conjunction with a rack assembly 100 such as is shown in FIGS. 4 and 5 to which are secured cable-terminated connectors 150, with junction box 10 including a backplane assembly 50 such as shown in FIGS. 6 and 10 for interconnecting the cable's conductors with circuits of an array of daughter cards 70 in the junction box. Junction box 10 is of the type disclosed in U.S. Pat. application Ser. No. 08/076654 filed Jun. 11, 1993 and assigned to the assignee hereof.

In FIG. 1 junction box 10 is shown in position mounted within tray section 102 of rack assembly 100 for in-service use, with rack assembly 100 of the present invention mounted on a shelf (not shown) within structure such as an aircraft or ship. Referring to FIGS. 1 and 4, junction box 10 is slidable along a boxreceiving receiving path 104 defined by bottom wall 106 and side walls 108 of tray portion 102, and is shown abutting panel member 110 traversing the end of box-receiving path 104. Panel member 110 is a rugged frame firmly affixed to tray portion 102, and includes mounted thereto several electrical connectors 150 terminating a plurality of cables 152 containing multiple electrical conductors 154. Junction box 10 is locked in position using locking hardware 112 at the forward end of tray section 102, engaging locking embossments 98 depending from junction box 10 proximate front face 24 See FIG. 2.

Junction box 10 is shown in greater detail in FIG. 2, with card-receiving region 60 including opposing pairs of card guide channels 62 extending inwardly from front face 24 to define guides for insertion of circuit cards such as daughter card 70 and matrix card 72. Thus junction box is essentially a compact, fully enclosed card cage. Backplane assembly 50 is provided proximate rear face 26 and includes a forward wall section 52 traversing the inwardmost extent of card-receiving region 60. Mounted onto forward wall section 52 is an array of card-associated electrical connectors 54 matable with complementary connectors 74 affixed to leading edges 76 of daughter cards 70 and matrix card 72. Backplane assembly 50 further includes interconnection circuitry 56 extending from forward wall section 52 to rearward wall section 58, which may comprise the rear wall of junction box 10 as shown if desired. Rear wall 16 includes mounted thereon an array of electrical input/output connectors 80 corresponding to connectors 150 mounted on frame 110 of rack assembly 100 (FIG. 4). Preferably rear wall 16 is joined to forward wall section 52 by a plurality of struts 82 peripherally of interconnection circuitry 56, so that backplane assembly 50 is manipulatable as a unit or subassembly insertable into body section 12 of junction box 10 at rear face 26 whereafter rear wall 16 is fastenable to rear edges of side walls 18 and top and bottom walls 20,22 thereof.

Junction box 10 defines an integral rugged electrically conductive envelope surrounding the backplane assembly and daughter cards which provides protection against electromagnetic and radiofrequency interference to assure the integrity of signals received, processed and transmitted by the electronic circuitry and components therewithin. The junction box also provides heat dissipation for the components and interconnections therewithin which have become isolated from the otherwise cooling effect of ambient air flow usually relied upon to remove thermal energy from electronics bays. Side walls 18, top and bottom walls 20,22, rear wall 16 and front panel 14 are preferably formed of an electrically conductive alloy with superior thermal conductivity such as aluminum Alloy No. 6061 suitable for welding. Further preferably, all seams between the wall members of the junction box are tight fitting with resilient EMI gaskets used where necessary such as the mounting interface of the front panel with the front face, and at the openings or cutouts in rear wall 16 for input/output connectors 80, thus eliminating all gaps which otherwise could permit EMI/RFI leakage into and out of the junction box. Such gaskets could be of conductive elastomer sold as CHO-SEAL 1285 by Chromerics, Inc.

The junction box thus provides a compact card cage of robust construction adapted to shield circuit cards and interconnections of circuits thereof with input/output conductors. With use of matrix card 72 or similar element the junction box has a circuit integration capability enabling simplification of the backplane assembly to become compact for a high population of circuit interconnections.

Embossments 98 are seen depending from bottom wall 22 in FIG. 2 at the front edge thereof, and are designed to be engaged by locking hardware 112 of rack assembly 100 when junction box 10 is inserted fully into rack assembly 100, as seen in FIG. 1. By being affixed to bottom wall 22, locking hardware 112 and embossments 98 continue holding junction box 10 in its locked in-service position mated to panel member 110 of rack assembly 100 at the input/output interface even when front panel 14 is removed from front face 24; the arrangement permits opening the junction box for insertion or removal of a particular daughter card while permitting all other daughter cards to remain in position with their circuits fully connected through the backplane assembly to the input/output conductors at the input/output interface at rear wall 16 and panel member 110 of rack assembly 100. Such capability greatly minimizes down time of an aircraft in which the junction box is mounted by rendering moot the necessity for retesting of the circuits and functions of the daughter cards not disconnected. Locking hardware may be of the extractor holddown type disclosed in U.S. Pat. No. 3,640,141.

Figure 3:
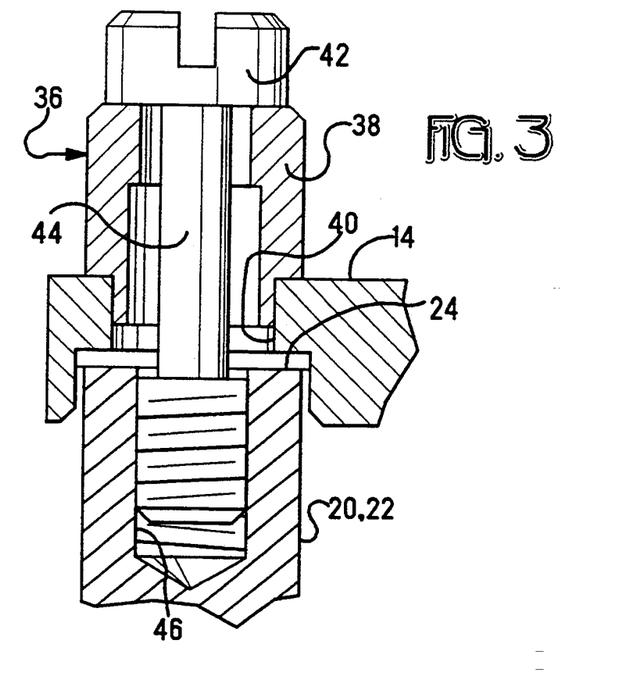
FIG. 3 is an enlarged part section view of a fastener for use in securing the front panel to the junction box of FIGS. 1 and 2.

FIG. 3 is an enlarged section view of a fastener assembly 36 of the type especially useful in mounting front panel 14 to front face 24 of junction box 10. Such fastener assembly 36 is conventional and one example is a captive panel screw available from Amatom, Inc. under Part Nos. 6766-SS-0832 and 6254-SS-1032. Housing 38 includes an axially extending flange pressfit into an aperture 40 through front panel 14. The tool-engageable head of screw member 42 is exposed outwardly of housing 38; an elongate small diameter portion of shank 44 extends through a cavity of housing 38 to a large diameter threaded end portion threadable into a correspondingly threaded aperture 46 into the front edge of top or bottom wall 20,22 of body section 12 of junction box 10. Upon screw member 42 being rotated to unthread the end portion from the threaded aperture 46, the larger-diameter threaded end portion of shank 44 is received into the housing cavity which maintains it captive in the fully unthreaded state. With such fasteners, no loose parts exist needing to be specially handled especially during rethreading, or possibly to become lost during the process of removing and replacing front panel 14 from front face 24 of junction box 10.

Rack assembly 100 of the present invention is shown in FIGS. 4 and 5. Bottom wall 106 and side walls 108 define a box-receiving path 104 extending to frame member 110, so that cable connectors 150 mounted thereon are positioned to become mated with corresponding input/output connectors 80 (see FIG. 7) of the rear wall of the junction box when junction box 10 is fully installed by being moved along box-receiving path 104. The arrangement permits all cables 152 to be installed as complete cable harnesses into an aircraft (along with rack assembly) separate in time from installation of the junction box, and permitting automatic mating of the connectors merely upon junction box being installed.

Figure 7:
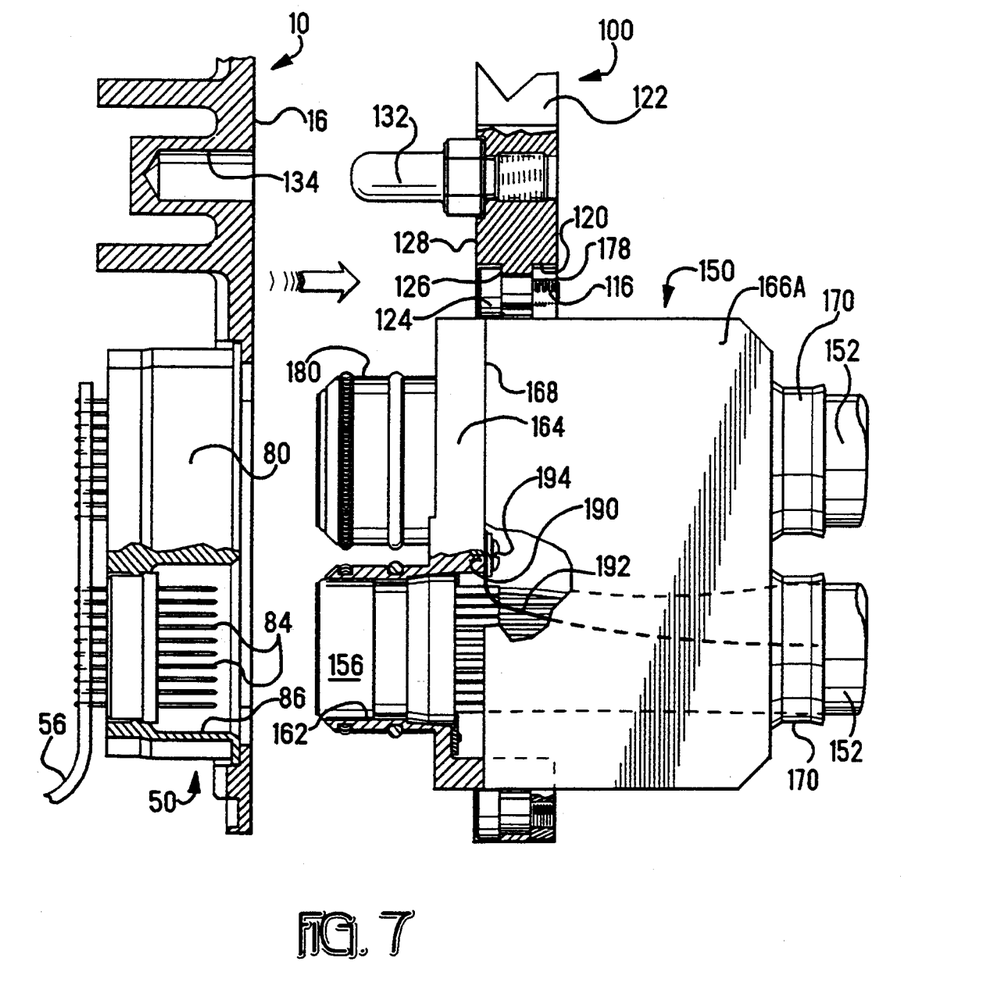
FIGS. 7 and 8 are part plan views and elevation views in cross-section of the input/output interface between the junction box and rack assembly of FIGS. 1 to 6.
Figure 8:
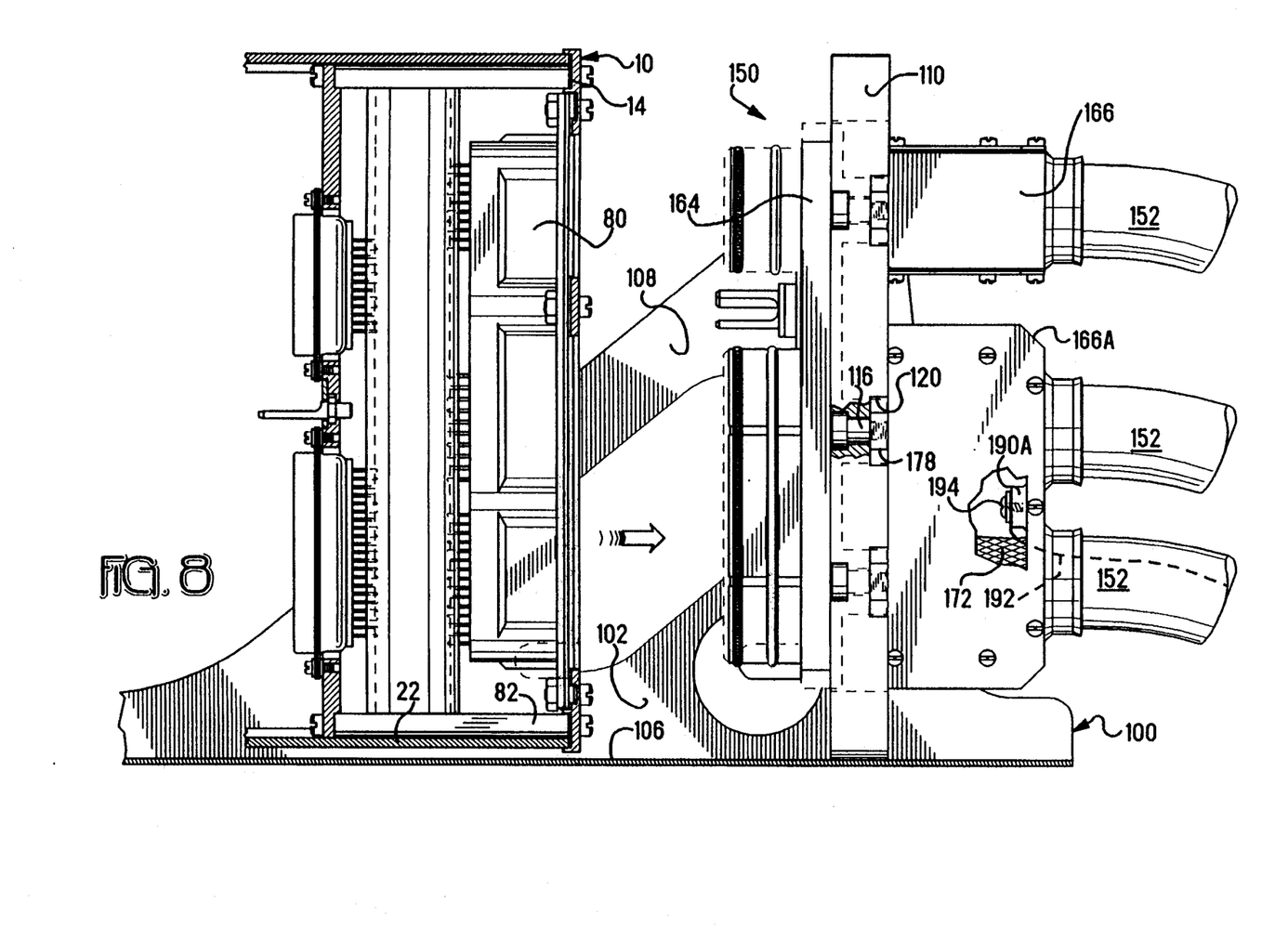

Rear wall 16 of junction box 10 is shown in FIG. 6, which is shown to be a portion of backplane assembly 50, to contain an array of input/output connectors 80 mounted therealong, simultaneously matable with cable connectors 150 on frame member 110, as illustrated in FIG. 7. Referring to FIGS. 5, 7 and 8, cable connectors 150 include dielectric housings 156 containing discrete terminals terminated to conductors 154 of the cables with contact sections 158 exposed at mating faces 160 thereof. Dielectric housings 156 are secured within cavities 162 of multiconnector shell members 164, and backshells 166 are affixed to rearward faces 168 of the shell members 164 to enclose lengths of discrete conductor wires 154 extending from each cable 152 for EMI/RFI protection, and include integral flanges 170 to which the shielding braids 172 of each cable 152 are affixed for grounding thereof; and the backshells 166 may be clamped to the cable outer insulative jackets 174 to provide strain relief for the cable connectors 150, if desired. A representative EMI gasket 176, such as a conductive elastomeric sheet, is shown disposed between backshells 166 and shell members 164 peripherally about the cavities and along the mounting interface eliminating any gap which otherwise could permit EMI/RFI leakage therethrough to eventually pass along the conductors and into the junction box. Also, connectors 150 include a means for terminating drain wires of cables 152, such as an embossment 190 of shell member 164 in FIG. 7 to which a drain wire 192 is connected by a screw 194, or an embossment 190A on the back wall of a backshell 166A by a screw 194 in FIG. 8.

Each shell member 164 is mountable within a cutout 114 of the panel member 110 or frame as shown in FIG. 5, using fasteners 116 which extend through recesses 118 about the cutout 114 and through apertures through mounting ears 178 of shell member 164. Mounting ears 178 are received into corresponding recesses 120 along cable face 122 of frame 110, and heads 124 of fasteners 116 are received into recesses 126 permitting the fastener heads to be disposed below the forward surface 128 of frame 110, clear of interfering with abutting engagement of frame 110 and junction box rear wall 16.

Figure 9:
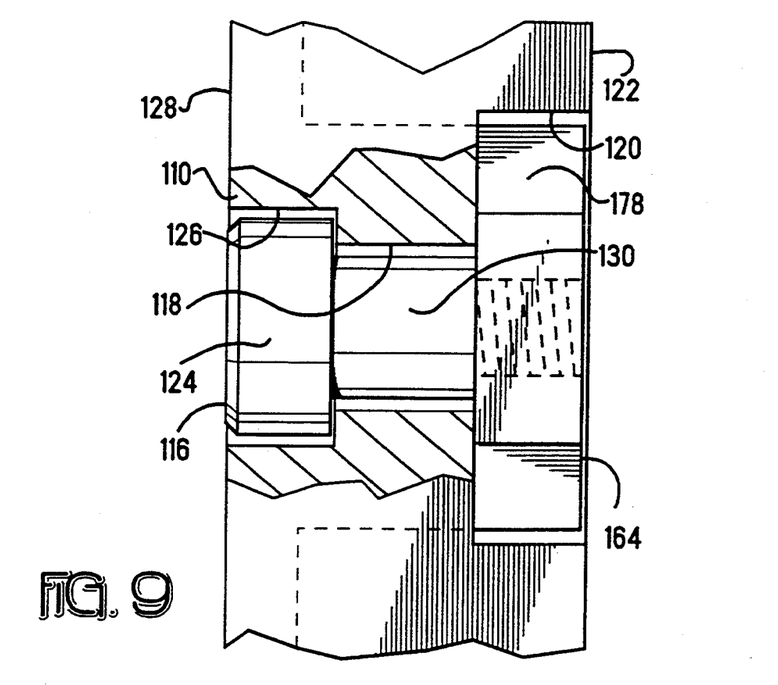
FIG. 9 is an enlarged section view of a float mount fastening arrangement of a cable connector in the frame of the rack assembly of FIGS. 4 to 8.

With reference especially to FIG. 9, shell members 164 each include a peripheral flange extending through the corresponding cutout 114 and are dimensioned slightly smaller than the cutout; the mounting ears 178 are also slightly smaller than the recesses 120 of frame 110 into which they are received; and shanks 130 of fasteners 116 are slightly smaller than recesses 118 of the frame through which they extend. This arrangement permits the shell members to float within cutouts 114 of frame 110, enabling incremental transverse adjustment of the cable connectors 150 during blind mating with corresponding connectors along rear wall 16 of junction box 10 in order to precisely align the contact sections 158 of terminals of the cable connectors with opposed contact sections 84 (FIG. 7) mating terminals of the connectors of the junction box. Initial engagement to incur the adjustment is established by leading edges of shrouds 180 defining shield members and surrounding mating faces of respective housings 156 which are received as plug sections into receptacle sections 86 of conductive shells surrounding the mating faces of mating connectors 80 and defining shield sections.

Also seen in FIGS. 4, 5 and 7 is post member 132 affixed to frame 110 and extending forwardly into the input/output interface to be received into a complementary post-receiving hole 134 into rear wall 16 of junction box 10 upon installation of junction box 10 in rack assembly 100. Post member 132 within hole 134 serves to maintain the position of junction box 10 within rack assembly 100 after installation to absorb stresses resulting from vibration of an aircraft which otherwise could stress the mated connectors and their mated terminals during in-service use and possibly even lead to intolerable momentary signal discontinuity; the post member also provides wear resistance benefits.

Backplane assembly 50 for junction box 10 is illustrated more clearly in FIGS. 6 and is disclosed in U.S. Pat. No. 5,348,482. Strut members 82 extend between upper and lower edges of rearward wall section 58 and bosses along upper and lower edges of forward wall section 52, thus securing forward and rearward wall sections 58,52 together. Interconnection circuitry 56 is disposed therebetween which provides connections between circuits of the interconnection circuitry with terminals of card-associated connectors mounted in forward wall section 52, which mate with corresponding terminals of connectors 74 mounted on leading edges 76 of daughter cards 70 and matrix card 72 (see FIG. 2), and terminals 84 of input/output connectors 80 mounted in rearward wall section 58, which mate with corresponding terminals of cable connectors 150 mounted on panel member 110 of rack assembly 100 at the input/output interface. Preferably interconnection circuitry 56 is a plurality of thin film flexible circuit elements overlaid to form a laminar package.

Input/output connectors 80 are disposed within shroud-like receptacle sections 86, which are shown to be sections of shell members securable to rearward wall section 58 by an array of fasteners extending through aligned apertures of a mounting flange of each shell member and rearward wall section 58.

Junction box 10, and the backplane assembly 50 used therewith, also are especially useful to define a wire integration system, in which circuits of the daughter cards 70 can be connected as desired to any particular conductor of the input/output interface. A matrix card 72 as seen in FIG. 2 is disclosed to be insertable into the junction box in the same manner as a daughter card at a particular location, and is used to interconnect circuits of various ones of the daughter cards and between a daughter card and an input/output conductor. Such a matrix card can be easily programmed by utilizing flexible circuits of particular customized circuit design (or discrete wire wrap segments between discrete pin members), which can be replaced on the matrix card if necessary. Backplane assembly 50 accommodates the use of such a programmable circuit integration member as matrix card 72, by directing substantially all circuits of the various flexible circuit elements of the laminar array from input/output terminals 84 only to terminals in matrix connection region from which circuit segments would extend to selected terminals associated with particular daughter cards. Thus backplane assembly 50 may be fabricated to a basic circuit configuration, with matrix card 72 providing customization for particular uses of the junction box 10, and enabling ease of reprogramming, all resulting in simplified construction of the backplane assembly which can easily handle providing circuits for over a thousand of individual terminal interconnections in a compact arrangement, as in the present design.

Variations and modifications may occur to the rack assembly of the embodiment disclosed herein, which may occur to the artisan, which are within the spirit of the invention and the scope of the claims.

What is claimed is:

1. An input/output interface for a junction box receiving a plurality of electrical conductors thereinto for a plurality of electrical interconnections of circuits of circuit cards with the electrical conductors, comprising:
   a junction box and a rack assembly defining a box-receiving path into and along which said junction box is slidably received to a mated position guided and generally positioned by vertical walls of said rack assembly, said rack assembly being mountable to a shelf;
   said junction box having opposed side walls and opposed top and bottom walls extending from a front face to a rear wall, a front panel member securable to said front face to define a front wall traversing a card-receiving opening, and a backplane assembly proximate said rear wall and positioned rearwardly of a card-receiving region proximate said front panel, all generally defining a card cage, with said side walls and top wall and bottom wall and rear wall and front panel member being formed of thermally and electrically conductive material of substantial thickness and being substantially free of openings, said side walls and said top and bottom walls adjoined to edges of adjacent ones thereof and said rear wall being adjoined to rear edges of said opposed side walls and said top and bottom walls in a manner to eliminate any gap thereat through which electromagnetic and radiofrequency energy could otherwise pass;

said backplane assembly defining an array of electrical circuits connecting terminals of card connectors mounted in an array on an interior wall facing said card-receiving region to respective first terminals of an array of first electrical input/output connectors mounted on said rear wall;

said rear wall including said array of first electrical input/output connectors mounted thereon adapted to be mated with complementary second electrical connectors at an input/output interface, with said first electrical input/output connectors including housed therein a plurality of said first electrical terminals electrically connected to circuits of said backplane assembly, and said rear wall including shield sections surrounding respective said first input/output connectors in a manner eliminating any gap peripherally therearound through which electromagnetic and radiofrequency energy could otherwise pass;

said rack assembly including a panel member traversing a rearward end of said box-receiving path, said panel member being of rugged and durable construction and assuredly affixed to said rack, said panel member having at least one cutout therethrough from a box-proximate forward face to a box-remote cable face and being of selected shape and dimension; and a corresponding at least one shell member being mounted to said panel member in said cutout and defining at least one cavity in and through which is secured at least one said second input/output connector having a plurality of second electrical terminals housed therein terminating corresponding electrical conductors of an associated cable, each said second input/output connector including therearound a shield member being complementary with a corresponding one of said shield sections on said rear wall of said junction box to define mated shields upon mating, and a resilient EMI conductive strip surrounding each plug section of one of said shield section and said shield member to groundingly engage with a receptacle section of the other thereof; and each said at least one shell member having a shape corresponding to said selected shape of said cutout and having a dimension slightly less than said selected dimension thereby being incrementally movable transversely during movement of said junction box against said panel member to align said electrical contacts therein with said electrical contacts of said first input/output connectors, whereby said junction box adapted to shield said circuit cards and electrical interconnections thereof with said electrical conductors from electromagnetic and radiofrequency interference and to facilitate dissipation of thermal energy therefrom, is slidably receivable into said rack assembly with said first connectors mounted along said back wall becoming assuredly electrically mated to corresponding said second connectors mounted along said panel member upon full sliding of said junction box along said box-receiving path until abutted against said panel member and is easily removable therefrom as a unit unmating the mated connectors.

2. An input/output interface as set forth in claim 1 wherein said junction box includes rugged embossments depending therefrom engageable by securing hardware affixed to said rack assembly at a forward edge of a bottom section of said rack assembly actuatable to secure said junction box in said mated position.

3. An input/output interface as set forth in claim 2 wherein said rugged embossments are affixed to said bottom wall of said junction box, enabling said front panel member to be removed therefrom for insertion or removal of a circuit card without disengaging said junction box from said mated position in said rack assembly.

4. An input/output interface as set forth in claim 1 wherein said panel member of said rack assembly includes a robust pin extending from said forward face thereof receivable into a complementary recess into said rear wall of said junction box upon movement of said junction box into said mated position thereafter relieving stress on said shield members during in-service use.

5. An input/output interface as set forth in claim 4 wherein said complementary recess is a blind recess preventing the occurrence of any gap therethrough.

6. An input/output interface as set forth in claim 1 wherein said rack assembly includes at least one backshell member affixed to a cable face of each said shield member and in grounding engagement therewith surrounding discrete conductor portions of at least one cable extending into an at least one said second input/output connector secured within a corresponding cavity of said shield member, and having a back wall section including a rearwardly extending annular flange associated with each said cable defining a cable exit therefor and enabling electrical connection thereto of a shielding braid of said cable, whereby each said shield member and associated backshell members are securable to all said cables to define a multi-cable harness manipulatable as a unit for mounting to said panel member along said cable face thereof and providing integral shielding of said second input/output connectors from electromagnetic and radiofrequency interference and providing strain relief therefor.

7. An input/output interface as set forth in claim 6 wherein a conductive gasket is placed around the leading edge of each said backshell member and between said leading edge and said shield member to assuredly provide electromagnetic and radiofrequency interference protection at the mounting interface of each said backshell member.

8. An input/output interface as set forth in claim 6 wherein each said backshell member includes a wire-connecting section adapted to be connected to at least one drain wire of at least one said cable.

9. An input/output interface as set forth in claim 6 wherein said backshell member is assembled from discrete sections to surround said discrete conductors of said at least one cable in a manner permitting disassembly.

10. An input/output interface as set forth in claim 9 wherein said back section includes a wire-connecting section adapted to be connected to at least one drain wire of at least one said cable.

11. An input/output interface as set forth in claim 6 wherein said shield member includes a wire-connecting section adapted to be connected to at least one drain wire of at least one said cable and positioned to be surrounded by said backshell member upon securement thereof to said shield member.

12. An input/output interface as set forth in claim 11 wherein said backshell member is an integral member initially positioned loosely along portions of all said cables to extend therethrough, and thereafter movable along all said cables to abut said panel member and be secured thereto after mounting of all said second input/output connectors in position.

13. An input/output interface as set forth in claim 1 wherein each said shell member includes at least a pair of mounting ears of selected shape and dimension extending laterally from opposed sides thereof, and said panel member includes correspondingly shaped recesses and having selected dimensions slightly larger than said mounting ears, and a mounting fastener extending through a first aperture through each said mounting ear and through a second aperture aligned therewith through a portion of said panel member rearwardly of said corresponding recesses with said second aperture being dimensioned larger than the diameter of a shank portion of said mounting fastener extending therethrough, all whereby said mounting ears are movable transversely therewithin to permit incremental adjustment in position of said shield member upon said junction box being moved into said mated position in said rack assembly and engagement of a leading edge thereof with a leading edge of a corresponding said shield section of said first input/output connectors of said rear wall of said junction box prior to mating of said first terminals with said second terminals.

14. An input/output interface as set forth in claim 13 wherein at least one said shell member includes a plurality of said cavities therethrough within each of which is secured a respective said second input/output connector.

15. An input/output interface as set forth in claim 13 wherein at least one said shell member includes a plurality of pairs of said mounting ears.

16. An input/output interface as set forth in claim 13 wherein each said second aperture is in communication with an edge of said cutout.

* * * * *